United States Patent
Tang et al.

(10) Patent No.: US 12,408,375 B2
(45) Date of Patent: Sep. 2, 2025

(54) ARRAY SUBSTRATE, DISPLAY DEVICE INCLUDING A LIGHT-SHIELDING AND HEAT-INSULATING LAYER IN A THIN FILM TRANSISTOR WHERE THE LIGHT-SHIELDING AND HEAT-INSULATING LAYER INCLUDES A LIGHT-SHIELDING MATRIX AND AN INTERTWINED CLUSTER STRUCTURE, AND FABRICATING MEHTOD

(71) Applicants: MIANYANG HKC OPTOELECTRONICS TECHNOLOGY CO., LTD, Mianyang (CN); HKC CORPORATION LIMITED, Shenzhen (CN)

(72) Inventors: Rong Tang, Mianyang (CN); Rongrong Li, Mianyang (CN)

(73) Assignees: MIANYANG HKC OPTOELECTRONICS TECHNOLOGY CO., LTD, Mianyang (CN); HKC CORPORATION LIMITED, Shenzhen (CN)

( * ) Notice: Subject to any disclaimer, the term of this patent is extended or adjusted under 35 U.S.C. 154(b) by 215 days.

(21) Appl. No.: 18/086,597

(22) Filed: Dec. 21, 2022

(65) Prior Publication Data
US 2023/0317854 A1   Oct. 5, 2023

(30) Foreign Application Priority Data
Mar. 30, 2022   (CN) .......... 202210325360.3

(51) Int. Cl.
*H10D 30/67* (2025.01)
*C23C 14/18* (2006.01)
(Continued)

(52) U.S. Cl.
CPC ......... *H10D 30/6723* (2025.01); *C23C 14/18* (2013.01); *C23C 14/24* (2013.01);
(Continued)

(58) Field of Classification Search
CPC ..................... G02F 2203/02; G02F 2202/36
See application file for complete search history.

(56) References Cited

U.S. PATENT DOCUMENTS

2015/0378182 A1* 12/2015 Shin .................. H10K 59/8792
252/586

FOREIGN PATENT DOCUMENTS

CN    101550003 A    10/2009
CN    109004032 A    12/2018
(Continued)

*Primary Examiner* — Lauren Nguyen

(57) ABSTRACT

An array substrate, a display device, and a fabricating method are disclosed. The array substrate includes a substrate and a thin film transistor disposed on the substrate. The thin film transistor includes a semiconductor layer, and further includes a light-shielding and heat-insulating layer, where the semiconductor layer is disposed above the light-shielding and heat-insulating layer. The light-shielding and heat-insulating layer includes a light-shielding matrix and a flake-shaped cluster structure. The light-shielding matrix includes a porous structure, the porous structure including multiple holes, and the flake-shaped cluster structure is disposed in these holes. The light-shielding and heat-insulating layer is used to shield incident light, and the flake-shaped cluster structure is used to absorb heat generated by the incident light.

11 Claims, 2 Drawing Sheets

(51) Int. Cl.
*C23C 14/24* (2006.01)
*G02F 1/1333* (2006.01)
*G02F 1/1362* (2006.01)
*G02F 1/1368* (2006.01)
*H10D 86/01* (2025.01)

(52) U.S. Cl.
CPC .. *G02F 1/133382* (2013.01); *G02F 1/136209* (2013.01); *G02F 1/13685* (2021.01); *H10D 86/021* (2025.01); *G02F 2202/36* (2013.01)

(56) References Cited

FOREIGN PATENT DOCUMENTS

| | | | | |
|---|---|---|---|---|
| CN | 109143661 A | | 1/2019 | |
| CN | 11-2549686 | * | 3/2021 | ............. B32B 33/00 |
| KR | 10-1983691 | * | 5/2019 | ............... G02B 5/20 |

* cited by examiner

ARRAY SUBSTRATE, DISPLAY DEVICE INCLUDING A LIGHT-SHIELDING AND HEAT-INSULATING LAYER IN A THIN FILM TRANSISTOR WHERE THE LIGHT-SHIELDING AND HEAT-INSULATING LAYER INCLUDES A LIGHT-SHIELDING MATRIX AND AN INTERTWINED CLUSTER STRUCTURE, AND FABRICATING MEHTOD

CROSS-REFERENCE TO RELATED APPLICATIONS

This application claims the priority and benefit of Chinese patent application 2022103253603, titled "Array Substrate, Display Device, and Fabricating method" and filed Mar. 30, 2022 with China National Intellectual Property Administration, the entire contents of which are incorporated herein by reference.

TECHNICAL FIELD

The present application relates to the field of display technology, and more particularly relates to an array substrate, a display device, and a fabricating method.

BACKGROUND

The description provided in this section is intended for the mere purpose of providing background information related to the present application but doesn't necessarily constitute prior art.

A backlight module is usually used to provide a light source in a liquid crystal display, and the light produced by the backlight module will be directly irradiated into the display panel, thereby providing a light source for the pixels in the liquid crystal display to realize image display. However, the thin-film transistors in the display panel are very sensitive to the intensity of the light and the temperature produced by the light. A thin-film transistor exposed to light for a long time may generate electron-hole pairs to create photo-generated carriers, which may severely affect the stability of the thin-film transistor. In addition, the light produced by the backlight module may generate a certain amount of heat when irradiating, causing the temperature to rise, and the temperature rise may also have a certain impact on the performance of the thin film transistor. Therefore, the impact of the light produced by the backlight module on the thin film transistor may lead to poor display such as crosstalk and afterimage in the display of the liquid crystal display, thereby affecting the quality of the liquid crystal display and reducing the user experience.

SUMMARY

In view of the above, it is a purpose of the present application to provide an array substrate, a display device, and a fabricating method, where by arranging a light-shielding and heat-insulating layer in a thin film transistor, the influence of the illumination of the backlight module on the thin film transistor is improved, and the quality of the LCD display and the user experience are improved.

The present application discloses an array substrate including a thin film transistor and a substrate. The thin film transistor is disposed on the substrate. The thin film transistor includes a semiconductor layer. The thin film transistor further includes a light-shielding and heat-insulating layer. The semiconductor layer is arranged above the light-shielding and heat-insulating layer. The light-shielding and heat-insulating layer includes a light-shielding matrix and a flake-shaped cluster structure. The light-shielding matrix includes a porous structure. The porous structure includes a plurality of holes, and the flake-shaped cluster structure is arranged in the holes. The light-shielding and heat-insulating layer is used to block incident light. The flake-shaped cluster structure may absorb the heat generated by the incident light.

In some embodiments, the thin film transistor further includes a gate metal layer, an insulating layer, a source metal layer, a drain metal layer and a passivation layer. The insulating layer is disposed on the gate metal layer and covers the gate metal layer. The semiconductor layer is disposed on the insulating layer. The source metal layer and the drain metal layer are disposed on the semiconductor layer and are spaced apart from each other. The passivation layer is disposed on the source metal layer, the drain metal layer, the semiconductor layer and the insulating layer. The light-shielding and heat-insulating layer is disposed on the side of the gate metal layer away from the semiconductor layer. Along the thickness direction of the substrate, the orthographic projection of the gate metal layer covers the semiconductor layer, and the orthographic projection of the light-shielding and heat-insulating layer covers the gate metal layer.

In some embodiments, the volume of the flake-shaped cluster structure varies with the temperature, and the volume of the flake-shaped cluster structure when the temperature is relatively high is larger than that when the temperature of the flake-shaped cluster structure is relatively low.

In some embodiments, the flake-shaped cluster structure includes a reflective material and an heat-absorbing material, in which the reflective material and the heat-absorbing material are mixed to form the flake-shaped cluster structure.

In some embodiments, the flake-shaped cluster structure includes a reflective material and an heat-absorbing material, in which the reflective material is disposed on the outer surface of the heat-absorbing material to form the flake-shaped cluster structure.

In some embodiments, the reflective material is one of silver, copper, aluminum, iron and titanium or an alloy of at least two thereof. The heat-absorbing material is any one of graphene sheet, polyaniline, carbon nanotube, carbon black, and zinc oxide. The light-shielding matrix is made of any one of polyurethane, ethylene/vinyl acetate copolymer, and cross-linked polyethylene.

The present application further discloses a display device, including a color filter substrate and the above-mentioned array substrate, wherein the color filter substrate and the array substrate are aligned and assembled together.

The present application further discloses a fabricating method, which is applied to the above-mentioned light-shielding and heat-insulating layer, including the following operations:

fabricating a light-shielding matrix with a porous structure inside;

fabricating a flake-shaped cluster structure; and dispersing the flake-shaped cluster structure with an oil-soluble solvent and coating it on the porous structure of the light-shielding matrix to form a light-shielding and heat-insulating layer;

where the flake-shaped cluster structure is made of a hydrophilic material.

In some embodiments, the operation of fabricating the flake-shaped cluster structure includes:

adding nano silver powder to a graphene flake powder dispersion;

performing ultrasonic dispersing and mixing for a preset time;

vacuum drying in a vacuum oven to form a flake-shaped cluster structure in which the graphene material and the nano-silver material are mixed with each other.

In some embodiments, the operation of fabricating the flake-shaped cluster structure includes:

placing the graphene flake powder in an evaporation box with nano silver; and evaporating the nano silver on the surface of the graphene sheet to form a flake-shaped cluster structure.

In the present application, a light-shielding and heat-insulating layer is arranged in the thin film transistor, the light-shielding and heat-insulating layer including a light-shielding matrix and a flake-shaped cluster structure; a porous structure is disposed inside the light-shielding matrix, and a plurality of holes are defined in the porous structure; the holes may isolate the heat generated by the incident light on the light-shielding and heat-insulating layer, reducing the influence of the heat generated by the light irradiating on the thin film transistor. Furthermore, the flake-shaped cluster structure may absorb the heat generated by the incident light, which further reduces the influence of the heat generated by the light irradiation on the thin film transistor. In addition, the light-shielding and heat-insulating layer may block part of the light generated by the backlight module, so as to prevent the light generated by the backlight module from being directly irradiated on the semiconductor layer and causing the thin-film transistor to generate electron-hole pairs and generate photo-generated carriers, thereby alleviating the influence of the light generated by the backlight module on the stability of the thin-film transistor and reducing the probability of poor display of the liquid crystal display, thus improving the quality of the liquid crystal display and the user experience.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

light-shielding matrix

DETAILED DESCRIPTION OF EMBODIMENTS

Figure 1:
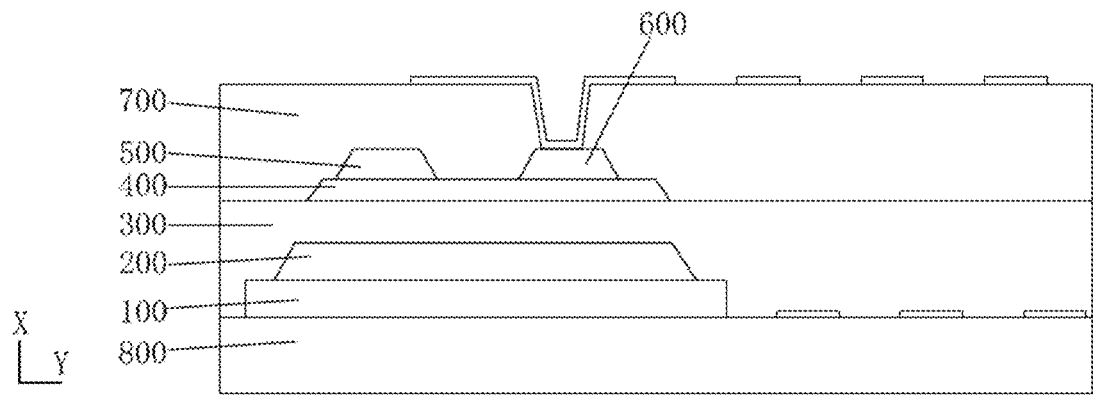
FIG. 1 is a schematic diagram of an overall structure of an array substrate according to a first embodiment of the present application.

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. Term "comprising", "including", and any variants thereof mean non-exclusive inclusion, so that one or more other features, integers, steps, operations, units, components, and/or combinations thereof may be present or added.

In addition, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application maybe understood depending on specific contexts.

The present application will be described in detail below with reference to the accompanying drawings and optional embodiments. It should be noted that, should no conflict is present, the various embodiments or technical features described below maybe combined arbitrarily to form new embodiments.

As shown in FIG. 1, as a first embodiment of the present application, an array substrate is disclosed. The array substrate includes a thin film transistor and a substrate 800. The thin film transistor is disposed on the substrate 800. The thin film transistor includes a semiconductor layer 400. The thin film transistor further includes a light-shielding and heat-insulating layer 100. The semiconductor layer 400 is disposed on the light-shielding and heat-insulating layer 100. The light-shielding and heat-insulating layer 100 includes a light-shielding matrix 110 and a flake-shaped cluster structure 120. The light-shielding matrix 110 includes a porous structure. The porous structure includes a plurality of holes. The flake-shaped cluster structure 120 is arranged in the holes. The light-shielding and heat-insulating layer 100 is used for blocking incident light. The flake-shaped cluster structure 120 is used for absorbing the heat generated by the incident light.

In an existing thin film transistor, the light from the backlight module usually has a certain impact on the thin film transistors. For example, a thin-film transistor exposed to light for a long time may generate electron-hole pairs, thereby creating photo-generated carriers, which may affect the stability of the thin-film transistor and cause the liquid crystal display to have poor display effects such as crosstalk and afterimage. An existing method dealing with this generally uses a thin film transistor with a bottom gate structure. The gate metal layer 200 of the thin film transistor with the bottom gate structure may be disposed under the semiconductor layer 400, and the gate metal layer 200 has a certain shielding effect on the light of the backlight module. However, the gate metal layer 200 will not isolate the heat generated by the light of the backlight module when irradiated, and so the heat produced by the light may still have a certain degree of influence on the thin film transistor. In contrast, in this embodiment, the light-shielding and heat-insulating layer 100 is disposed in the thin film transistor, and the semiconductor layer 400 is disposed above the light-shielding and heat-insulating layer 100. The light-shielding and heat-insulating layer 100 includes a light-shielding matrix 110 and a flake-shaped cluster structure 120. The light-shielding matrix 110 includes a porous structure inside, and the porous structure includes a plurality of holes. The arrangement of the holes may isolate the heat generated by the incident light of the backlight module, so that the heat generated by the incident light irradiation will not be conducted to the semiconductor layer 400 inside the thin film transistor to affect the semiconductor layer 400. At the same time, the flake-shaped cluster structure 120 may also absorb the heat generated by the light irradiated on the light-shielding matrix 110 of the light-shielding and heat-insulating layer 100. The combined design of the porous structure and the flake-shaped cluster structure 120 of the light-shielding matrix 110 reduces the influence of the heat produced by the light generated by the backlight module on the thin film transistor. In addition, the light-shielding and heat-insulating layer 100 may block part of the light generated by the backlight module, and the light generated by the backlight module will not directly irradiate on the semiconductor layer 400 to cause the thin film transistor to generate electron-hole pairs to create photo-generated carriers, thereby improving the influence of the light generated by the backlight module on the stability of the thin film transistor, and reducing the probability of poor display in the liquid crystal display using the thin film transistor, thus improving the quality of the liquid crystal display and the user experience.

The thin film transistor in this embodiment may be a thin film transistor with a top gate structure design or a thin film transistor with a bottom gate structure design. Hereinafter the thin film transistor with bottom gate structure will be taken as an example for purposes of description.

In particular, as shown in FIG. 1, the thin film transistor further includes a gate metal layer 200, an insulating layer 300, a source metal layer 500, a drain metal layer 600 and a passivation layer 700. The insulating layer 300 is disposed on the gate metal layer 200 and covers the gate metal layer 200. The semiconductor layer 400 is disposed on the insulating layer 300. The source metal layer 500 and the drain metal layer 600 are disposed on the semiconductor layer 400 and spaced apart from each other. The passivation layer 700 is disposed on the source metal layer 500, the drain metal layer 600, the semiconductor layer 400, and the insulating layer 300. The light-shielding and heat-insulating layer 100 is disposed on the side of the gate metal layer 200 away from the semiconductor layer 400. Along the thickness direction of the substrate 800, that is, the X-axis direction shown in FIG. 1, the orthographic projection of the gate metal layer 200 covers the semiconductor layer 400, and the orthographic projection of the light-shielding and heat-insulating layer 100 covers the gate metal layer 200. That is, the width of the light-shielding and heat-insulating layer 100 is greater than the width of the gate metal layer 200, and the width of the gate metal layer 200 is greater than the width of the semiconductor layer 400, where the width direction here refers to the Y axis direction shown in FIG. 1. In this embodiment, by arranging the gate metal layer 200 above the light-shielding and heat-insulating layer 100, the gate metal layer 200 and the light-shielding and heat-insulating layer 100 are combined to form a secondary light-shielding structure for the semiconductor layer 400, so that the semiconductor layer 400 will not be directly irradiated by light, which alleviates the influence of the light generated by the backlight module on the stability of the thin film transistor. In addition, the width of the light-shielding and heat-insulating layer 100 is greater than the width of the gate metal layer 200, so that the light-shielding and heat-insulating layer 100 may completely block the gate metal layer 200 so that it is avoided that the heat generated by the light after the light is irradiated on the gate metal layer 200 increases the temperature of the gate metal layer 200 thereby affecting the thin film transistor to a certain extent.

Figure 3:
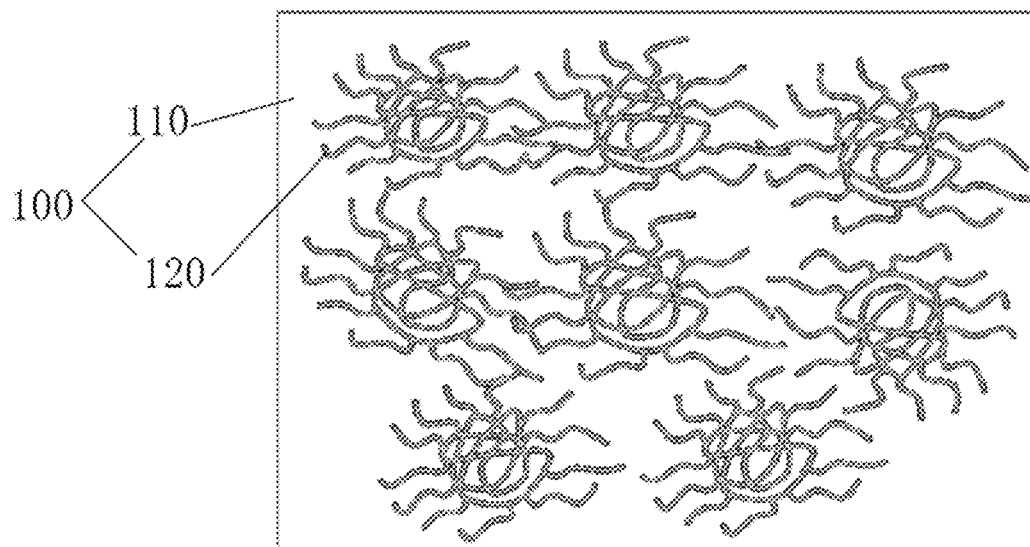
FIG. 3 is a schematic diagram of a light-shielding matrix and a flake-shaped cluster structure in the light-shielding and heat-insulating layer in the first embodiment of the present application when the temperature is high.
Figure 4:
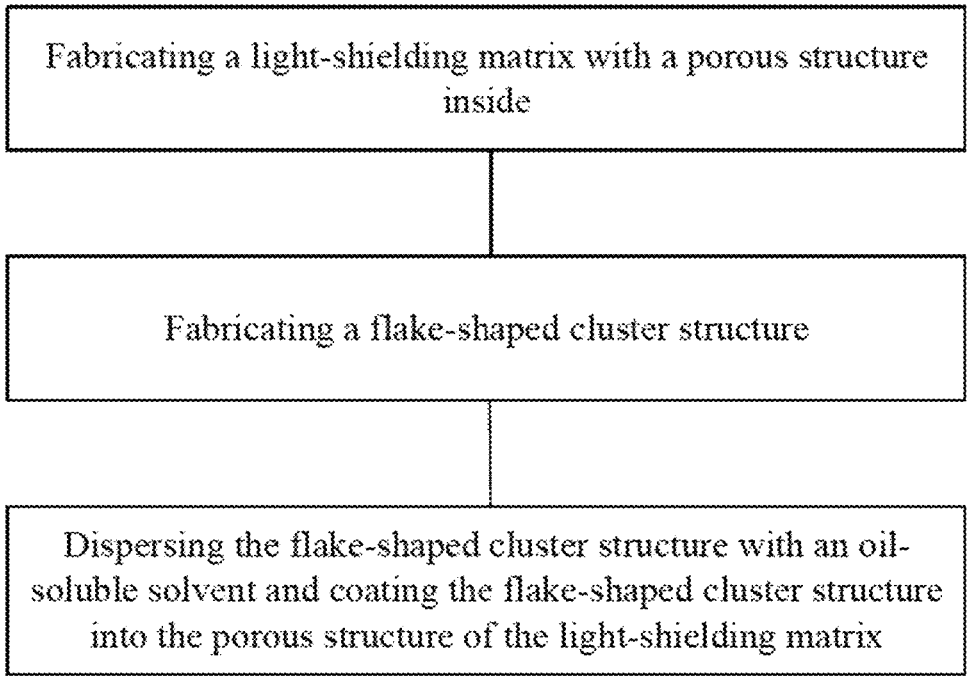
FIG. 4 is a flow chart of a fabricating method according to a third embodiment of the present application.

The volume of the flake-shaped cluster structure 120 may change as the temperature changes. The volume of the flake-shaped cluster structure 120 when the temperature is high is larger than that of the flake-shaped cluster structure 120 when the temperature is low. The flake-shaped cluster structure 120 is disposed in the holes of the porous structure of the light-shielding matrix 110. When the light generated by the backlight module is irradiated on the light-shielding and heat-insulating layer 100, part of the light may enter the holes of the porous structure of the light-shielding matrix 110. The heat generated when the light is irradiated may be absorbed by the flake-shaped cluster structure 120 located in the holes, so that the flake-shaped cluster structure 120 located in the holes may be deformed. As shown in FIG. 3, when the space of the holes is filled, the flake-shaped cluster structure 120 converts the absorbed heat into the energy required for deformation, so as to prevent the flake-shaped cluster structure 120 from absorbing too much heat and causing the temperature to rise, thereby causing impact. When the flake-shaped cluster structure 120 absorbs heat and deforms, the volume of the flake-shaped cluster structure 120 may not completely fill the space of the holes. That is, there is still space in the holes to isolate heat, so that the heat insulation performance of the light-shielding and heat-insulating layer 100 may not decrease due to the deformation of the flake-shaped cluster structure 120.

Figure 2:
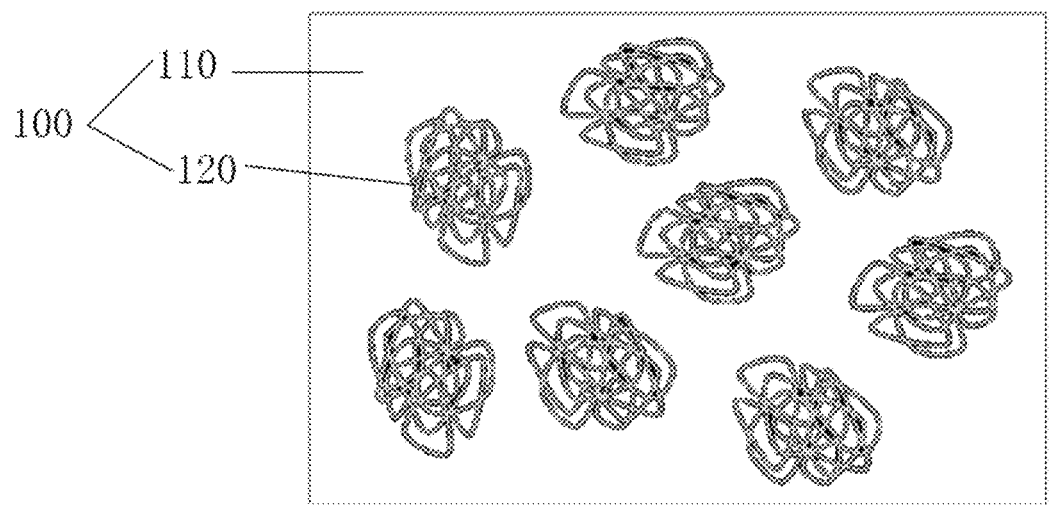
FIG. 2 is a schematic diagram of a light-shielding matrix and a flake-shaped cluster structure in the light-shielding and heat-insulating layer according to the first embodiment of the present application when the temperature is low.

Furthermore, in this embodiment, the flake-shaped cluster structure 120 includes a reflective material and an heat-absorbing material. The flake-shaped cluster structure 120 is made of the reflective material and the heat-absorbing material together, so that the flake-shaped cluster structure 120 not only has the function of absorbing heat, but also may partially reflects the light entering the holes of the porous structure of the light-shielding matrix 110, so as to improve the utilization of the light generated by the backlight module. Furthermore, the flake-shaped cluster structure 120 may deform after absorbing heat, increasing the volume of the flake-shaped cluster structure 120, that is, increasing the area of the flake-shaped cluster structure 120 irradiated by light, so that the light that maybe reflected by the flake-shaped cluster structure 120 is increased, and the utilization of the light generated by the backlight module is further improved. When the backlight module stops emitting light, the flake-shaped cluster structure 120 cannot absorb heat, and the flake-shaped cluster structure 120 may slowly recover to a state close to that when it is not affected by light irradiation, as shown in FIG. 2, so as to prepare for the heat absorption of the light and the reflection of the light when the backlight module works next time.

The reflective material may be one of silver, copper, aluminum, iron, and titanium, or an alloy of at least two of the above. The heat-absorbing material maybe any one of graphene sheets, polyaniline, carbon nanotubes, carbon black, and zinc oxide. The light-shielding matrix 110 is made of any one of polyurethane, ethylene/vinyl acetate copolymer and cross-linked polyethylene. Designers may also choose and design among different options depending on the needs of use, which is not limited here.

The reflective material and the heat-absorbing material may be mixed to form the flake-shaped cluster structure 120, or the reflective material may be disposed on the outer surface of the heat-absorbing material to form the flake-shaped cluster structure 120. The production staff may choose depending on the needs of the actual production process, which is not to be limited here.

As a second embodiment of the present application, a display panel is disclosed, which includes an array substrate and the thin film transistor described in any one of the above embodiments, where the thin film transistor is fabricated on the array substrate.

As the third embodiment of the present application, a fabricating method is disclosed, which is applied to the light-shielding and heat-insulating layer as described in the first embodiment, the fabricating method including the following operations:

fabricating a light-shielding matrix with a porous structure inside;
fabricating a flake-shaped cluster structure; and
dispersing the flake-shaped cluster structure with an oil-soluble solvent and coating it on the porous structure of the light-shielding matrix to form a light-shielding and heat-insulating layer;
where the flake-shaped cluster structure is made of a hydrophilic material. Because the material used for the flake-shaped cluster structure is a hydrophilic material, it is insoluble in the oil-soluble solvent, so the flake-shaped cluster structure is dispersed by the oil-soluble solvent. However, the flake-shaped cluster structure does not dissolve, that is, the shape and structure of the flake-shaped cluster structure are maintained, and the flake-shaped cluster structure dispersed by the oil-soluble solvent is coated and dispersed in the light-shielding matrix. After the oil-soluble solvent is volatilized and dried, a light-shielding and heat-insulating layer maybe obtained, and the thickness of the light-shielding and heat-insulating layer is between 0.2 μm and 2 μm.

In particular, the specific steps for fabricating a light-shielding matrix with a porous structure inside will be described below by taking the light-shielding matrix as polyurethane as an example:

weighing 20 g of trihydroxy polyether, dropping 0.2 g of silicone oil, 2 g of dichloromethane, and 0.6 g of dibutyltin disilicate in sequence;
uniformly stirring for two hours at a temperature of 40° C. to 70° C.;
adding 0.15 g triethylenediamine and 0.2 g diethylenetriamine, stirring uniformly for one hour;
adding 11 g of polyether polyol, stirring to the state of a viscous substance within one minute;
drying the viscous substance to obtain a light-shielding matrix with a porous structure inside.

In particular, there are two fabricating methods for the specific steps of fabricating the flake-shaped cluster structure, which will be described separately below.

When the flake-shaped cluster structure is made of a mixture of a reflective material and an heat-absorbing material, the heat-absorbing material is a graphene material as an example, and the reflective material is nano-scale silver as an example, and accordingly the steps of the fabricating method of the flake-shaped cluster structure are as follows:

adding nano silver powder to a graphene flake powder dispersion;
performing ultrasonic dispersing and mixing for two hours;
vacuum drying in a vacuum oven to form a flake-shaped cluster structure in which the graphene material and the nano-silver material are mixed with each other.

When the flake-shaped cluster structure is made of a reflective material disposed on the outer surface of the heat-absorbing material, the heat-absorbing material is a graphene material as an example, and the reflective material is nanoscale silver as an example, and accordingly the steps of the fabricating method of the flake-shaped cluster structure are as follows:

placing the graphene flake powder in an evaporation box with nano silver, so that the nano silver is evaporated on the surface of the graphene sheet to form a flake-shaped cluster structure; or adding graphene flake powder into a nano silver dispersion liquid, uniformly dispersing by stirring or ultrasound, and drying in a vacuum oven to form the flake-shaped cluster structure.

The technical solutions of the present application maybe widely used in various display panels, such as TN (Twisted Nematic) display panels, IPS (In-Plane Switching) display panels, VA (Vertical Alignment) display panels, and MVA (Multi-Domain Vertical Alignment) display panels panel. Of course, other types of display panels, such as OLED (Organic Light-Emitting Diode) display panels, may also be applicable to the above solutions.

It should be noted that the inventive concept of the present application maybe formed into many embodiments, but the length of the application document is limited and so these embodiments cannot be enumerated one by one. The technical features maybe arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. An array substrate, comprising a substrate and a thin film transistor disposed on the substrate; wherein the thin film transistor comprises a semiconductor layer and further comprises a light-shielding and heat-insulating layer, wherein the semiconductor layer is disposed above the light-shielding and heat-insulating layer;

wherein the light-shielding and heat-insulating layer comprises a light-shielding matrix and a intertwined cluster structure; wherein the light-shielding matrix comprises a porous structure, the porous structure comprising a plurality of holes, and the intertwined cluster structure is disposed in the plurality of holes;

wherein the light-shielding and heat-insulating layer is configured for shielding incident light, and the intertwined cluster structure is configured for absorbing heat generated by the incident light;

wherein the intertwined cluster structure comprises a reflective material and a heat-absorbing material, and wherein the reflective material and the heat-absorbing material are mixed to form the intertwined cluster structure; wherein the reflective material is an alloy of at least two selected from the group consisting of silver, copper, aluminum, iron, and titanium; and wherein the heat-absorbing material is any one selected from the group consisting of a graphene sheet, polyaniline, a carbon nanotube, carbon black, and zinc oxide.

2. The array substrate of claim 1, wherein the thin film transistor further comprises a gate metal layer, an insulating layer, a source metal layer, a drain metal layer, and a passivation layer; wherein the insulating layer is disposed on the gate metal layer and covers the gate metal layer; the semiconductor layer is disposed on the insulating layer; the source metal layer and the drain metal layer are disposed on the semiconductor layer and are spaced apart from each other; the passivation layer is disposed on the source metal layer, the drain metal layer, the semiconductor layer, and the insulating layer;

wherein the light-shielding and heat-insulating layer is disposed on a side of the gate metal layer facing away from the semiconductor layer;

wherein along a thickness direction of the substrate, an orthographic projection of the gate metal layer covers the semiconductor layer, and an orthographic projection of the light-shielding and heat-insulating layer covers the gate metal layer.

3. The array substrate of claim 1, wherein a volume of the intertwined cluster structure varies with temperature, and wherein the volume of the intertwined cluster structure when the temperature thereof is relatively high is lower than that of the intertwined cluster structure when the temperature thereof is relatively low.

4. An array substrate, comprising a substrate and a thin film transistor disposed on the substrate; wherein the thin film transistor comprises a semiconductor layer and further comprises a light-shielding and heat-insulating layer, wherein the semiconductor layer is disposed above the light-shielding and heat-insulating layer;

wherein the light-shielding and heat-insulating layer comprises a light-shielding matrix and a intertwined cluster structure; wherein the light-shielding matrix comprises a porous structure, the porous structure comprising a plurality of holes, and the intertwined cluster structure is disposed in the plurality of holes;

wherein the light-shielding and heat-insulating layer is configured for shielding incident light, and the intertwined cluster structure is configured for absorbing heat generated by the incident light;

wherein the intertwined cluster structure comprises a reflective material and a heat-absorbing material, and wherein the reflective material is disposed on an outer surface of the heat-absorbing material to form the intertwined cluster structure;

wherein the reflective material is one selected from the group consisting of silver, copper, aluminum, iron, and titanium, or is an alloy of at least two selected from the above group;

wherein the heat-absorbing material is any one selected from the group consisting of a graphene sheet, polyaniline, a carbon nanotube, carbon black, and zinc oxide; and wherein the light-shielding matrix is made of any one selected from the group consisting of polyurethane, ethylene/vinyl acetate copolymer, and cross-linked polyethylene.

5. The array substrate of claim 1, wherein when the intertwined cluster structure absorbs heat and deforms, a volume of the intertwined cluster structure does not completely fill a space of the plurality of holes.

6. The array substrate of claim 1, wherein a thickness of the light-shielding and heat-insulating layer lies in the range between 0.2 µm and 2 µm.

7. The array substrate of claim 1, wherein the intertwined cluster structure is made of a hydrophilic material, and is coated and dispersed in the light-shielding matrix.

8. The array substrate of claim 1, wherein the thin film transistor is a thin film transistor having a top gate structure; the thin film transistor further comprises a gate metal layer, an insulating layer, a source metal layer, a drain metal layer, and a passivation layer;

wherein the insulating layer is disposed on the light-shielding and heat-insulating layer and covers the light-shielding and heat-insulating layer; the semiconductor layer is disposed on the insulating layer; the source metal layer and the drain metal layer are disposed on the semiconductor layer and are spaced apart from each other; the passivation layer is disposed on the source metal layer, the drain metal layer, the semiconductor layer, and the insulating layer; and the gate metal layer is disposed on the passivation layer;

wherein along a thickness direction of the substrate, an orthographic projection of the gate metal layer covers the semiconductor layer, and an orthographic projection of the light-shielding and heat-insulating layer covers the gate metal layer.

9. A display device, comprising a color filter substrate and an array substrate, which are aligned and assembled together;

wherein the array substrate comprises a substrate and a thin film transistor disposed on the substrate; wherein the thin film transistor comprises a semiconductor layer, and further comprises a light-shielding and heat-insulating layer, wherein the semiconductor layer is disposed on the light-shielding and heat-insulating layer;

wherein the light-shielding and heat-insulating layer comprises a light-shielding matrix and a intertwined cluster structure, wherein the light-shielding matrix comprises a porous structure, the porous structure comprising a plurality of holes, and wherein the intertwined cluster structure is disposed in the plurality of holes;

wherein the light-shielding and heat-insulating layer is configured for shielding incident light, and the intertwined cluster structure is configured for absorbing heat generated by the incident light;

wherein the intertwined cluster structure comprises a reflective material and a heat-absorbing material, and wherein the reflective material and the heat-absorbing material are mixed to form the intertwined cluster structure; wherein the reflective material is an alloy of at least two selected from the group consisting of silver, copper, aluminum, iron, and titanium; and wherein the heat-absorbing material is any one selected from the group consisting of a graphene sheet, polyaniline, a carbon nanotube, carbon black, and zinc oxide.

10. The display device of claim 9, wherein the thin film transistor further comprises a gate metal layer, an insulating layer, a source metal layer, a drain metal layer, and a passivation layer; wherein the insulating layer is disposed on the gate metal layer and covers the gate metal layer; the semiconductor layer is disposed on the insulating layer; the source metal layer and the drain metal layer are disposed on the semiconductor layer and are spaced apart from each other; the passivation layer is disposed on the source metal layer, the drain metal layer, the semiconductor layer, and the insulating layer;

wherein the light-shielding and heat-insulating layer is disposed on a side of the gate metal layer facing away from the semiconductor layer;

wherein along a thickness direction of the substrate, an orthographic projection of the gate metal layer covers the semiconductor layer, and an orthographic projection of the light-shielding and heat-insulating layer covers the gate metal layer.

11. The display device of claim 9, wherein a volume of the intertwined cluster structure varies with temperature, and wherein the volume of the intertwined cluster structure when the temperature thereof is relatively high is larger than that of the intertwined cluster structure when the temperature thereof is relatively low.

* * * * *